United States Patent [19]
Zimmer et al.

[11] Patent Number: 5,508,955
[45] Date of Patent: Apr. 16, 1996

[54] ELECTRONICALLY ERASABLE-PROGRAMMABLE MEMORY CELL HAVING BURIED BIT LINE

[75] Inventors: Jan Zimmer, Milpitas; Nagesh Challa, Sunnyvale, both of Calif.

[73] Assignee: Nexcom Technology, Inc., Sunnyvale, Calif.

[21] Appl. No.: 64,531

[22] Filed: May 20, 1993

[51] Int. Cl.$^6$ ............................ G11C 7/00; H01L 29/788
[52] U.S. Cl. ...................... 365/185.16; 257/315; 257/316
[58] Field of Search ........................... 365/185; 257/365, 257/390, 314–320

[56] References Cited

U.S. PATENT DOCUMENTS

| | | | |
|---|---|---|---|
| 4,328,565 | 5/1982 | Harari | 365/185 |
| 4,622,656 | 11/1986 | Kamiya | 365/185 |
| 4,639,893 | 1/1987 | Eitan | 365/185 |
| 4,949,140 | 8/1990 | Tam | 257/316 |
| 4,996,668 | 2/1991 | Paterson et al. | 365/185 |
| 5,041,886 | 8/1991 | Lee | 365/185 X |
| 5,047,814 | 9/1991 | Hazani | 365/185 X |
| 5,101,250 | 3/1992 | Arima | 365/185 X |
| 5,115,288 | 5/1992 | Manley | 365/185 X |
| 5,130,769 | 7/1992 | Kuo | 257/316 |
| 5,241,499 | 8/1993 | Camerlenghi | 365/185 X |
| 5,262,987 | 11/1993 | Kojima | 365/185 |

OTHER PUBLICATIONS

Paper entitled, "A 128K Flash EEPROM Using Double-Polysilicon Technology", written by Gheorghe Samachisa, et al, reprinted from IEEE J. Solid-State Circuits, vol. SC-22, No. 5, pp. 676–683, Oct. 1987, IEEE Log Number 8716433, pp. 176–182.

Paper entitled, "A New Self-Aligned Planar Array Cell for Ultra High Density EPROMS", written by A. T. Mitchel, et al., Semiconductor Process and Design Center, Texas Instruments Incorporated, reprinted from the IEDM Tech. Dig., pp. 548–553, 1987; IEDM pp. 96–99.

Paper entitled, "An Experimental 4-Mb Flash EEPROM with Sector Erase", written by Mike McConnell, et al., IEEE Journal of Solid-State Circuits, vol. 26, No. 4, Apr. 1991, pp. 484–491.

*Primary Examiner*—David C. Nelms
*Assistant Examiner*—Son Mai
*Attorney, Agent, or Firm*—Skjerven, Morrill, MacPherson, Franklin & Friel; David H. Carroll

[57] ABSTRACT

A memory cell (510) suitable for an array of memory cells (100) has a source that is part of a buried bit line and a drain that is part of an adjacent buried bit line. The memory cell also includes a split gate arrangement (580) in which the gate is integral with the word line (120), with a part of the gate being the control gate of an EEPROM transistor which erases and programs on the principle of Fowler-Nordheim tunneling (560, 570), and another part of the gate being the control gate of a series select transistor. The memory cell is erased by placing a voltage on the word line which is positive relative to the bit line and the substrate and of sufficient magnitude to cause tunneling. The memory cell is programmed by placing a negative voltage on the word line and a voltage corresponding to the logical value on the bit line. The bit line voltage is sufficient to cause tunneling for one logical value, and insufficient to cause tunneling for the other logical value. The memory cell is read by placing a sense voltage across the bit lines forming its source and drain, and a read voltage on the control gate. Other bit lines are left floating.

28 Claims, 5 Drawing Sheets

5,508,955

ELECTRONICALLY ERASABLE-PROGRAMMABLE MEMORY CELL HAVING BURIED BIT LINE

BACKGROUND OF THE INVENTION

1. Field of the Invention

This invention relates to memory cell arrays, and more particularly to arrays of electrically erasable and programmable memory cells which are based on Fowler-Nordheim tunneling.

2. Background of the Invention

One of the important factors for a successful memory design is minimization of the size of the memory array. Flash EEPROM (electrically erasable and programmable read-only memory) technology provides a cell size similar to EPROM (erasable programmable read-only memory) technology as well as electrical erasability.

Because EEPROM devices are electrically erasable, they do not require the expensive ceramic-quartz window packages used for conventional EPROM devices. On the other hand, electrical erasing can leave the floating gate positively charged, converting the memory transistor into a depletion mode transistor.

Techniques have been developed to avoid positively charging the floating gate during erasure. One technique known as adaptive erasure uses an algorithm to control the amount of charge applied to the memory transistor during erasure. Unfortunately, adaptive erasure has the disadvantage of being relatively slow and difficult to implement in large memory arrays. Another approach uses a cell that comprises a floating gate memory transistor similar to an EPROM cell connected in series with a simple enhancement transistor controlled by the word line. This cell, which is more fully described in Samachisa et al, "A 128K Flash EEPROM Using Double-Polysilicon Technology," IEEE J. Solid-State Circuits, Vol. SC-22, No. 5, October 1987, pp. 676–683, avoids leakage current during programming and reading because of the action of the series enhancement transistor. The EPROM device in the cell is erased using Fowler-Nordheim tunneling and programmed using hot-electron injection, which is typical for EPROM devices. Unfortunately, the presence of the series enhancement transistor increases the size of the Flash EEPROM cell of Samachisa et al.

Given the considerable commercial importance placed on small memory size, further miniaturization in cell and array size is desirable.

SUMMARY OF THE INVENTION

An advantage of one or more embodiments of the present invention is the achievement of a small EEPROM memory cell size. A further advantage of one or more embodiments of the present invention is the achievement of EEPROM operation without concern for the memory transistor of the cell entering into depletion mode.

These and other advantages are achieved in the present invention, which in one embodiment is a memory cell having first and second electrically conductive lines of a second conductivity type disposed in a semiconductor body of a first conductivity type. The first line includes a data carrying capability. A first section of the memory cell comprises a drain formed at least in part by the first line, a floating gate, a first control gate, and a first channel region adjacent the drain and within control of the floating gate and the first control gate. A second section of the memory cell comprises a source formed at least in part by the second line, a second control gate, and a second channel region adjacent the source and within control of the second control gate. The first and second control gates are integral and the first and second channel regions are integral.

In another embodiment of the present invention, a memory array comprises a plurality of data carrying lines, a plurality of word lines, and a plurality of memory cells. Each of the memory cells comprises a select transistor coupled to an EEPROM transistor. The EEPROM transistor has a floating gate and also a drain coupled to an associated one of the data carrying lines. The select transistor has a source coupled to a data carrying line adjacent the associated data carrying line. The gates of the select transistor and the EEPROM transistor are commonly coupled to an associated one of the word lines.

DETAILED DESCRIPTION OF THE PREFERRED EMBODIMENT

Figure 1:
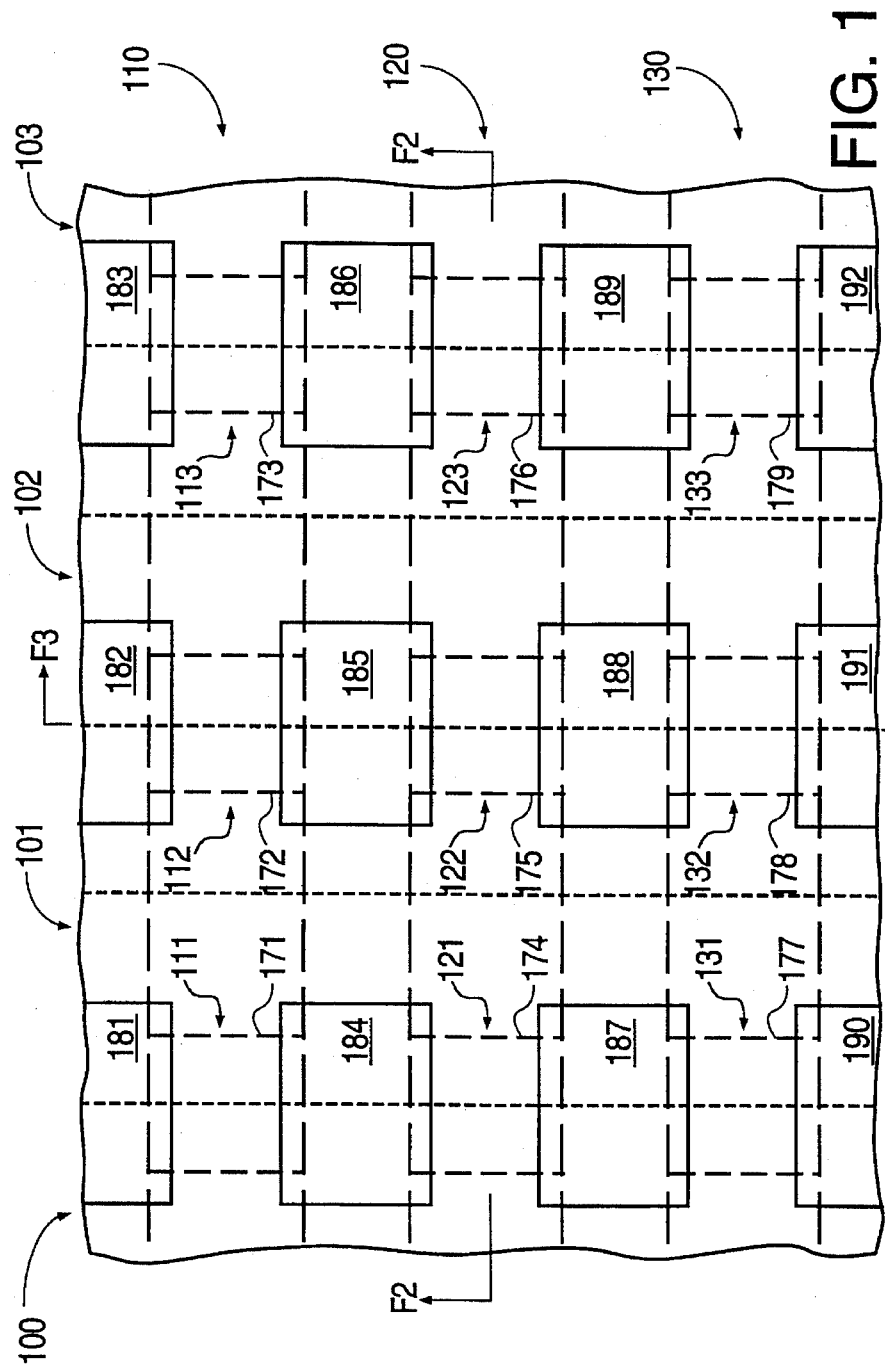
FIG. 1 is a composite layout diagram of an array of EEPROM memory cells.
Figure 2:
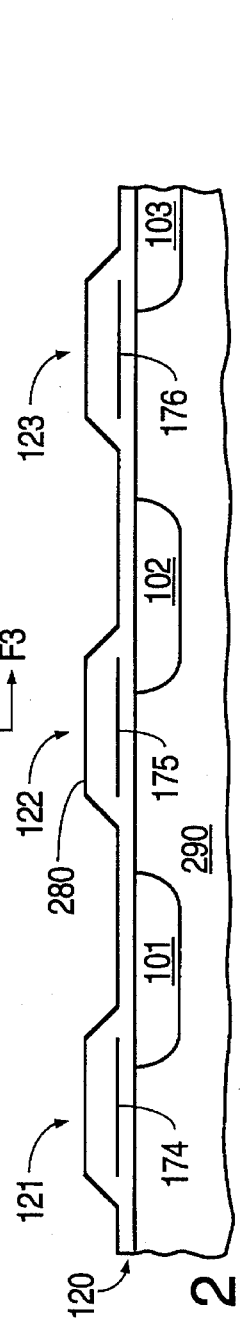
FIGS. 2 and 3 are cross-sectional diagrams of sections F2—F2 and F3—F3 through a memory array based on the layout of FIG. 1.
Figure 3:
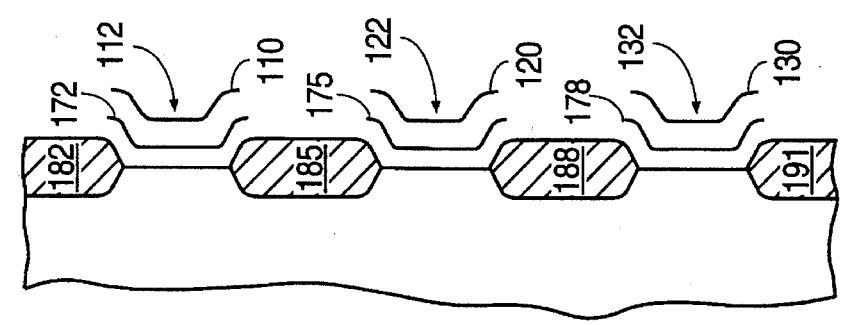
Figure 4:
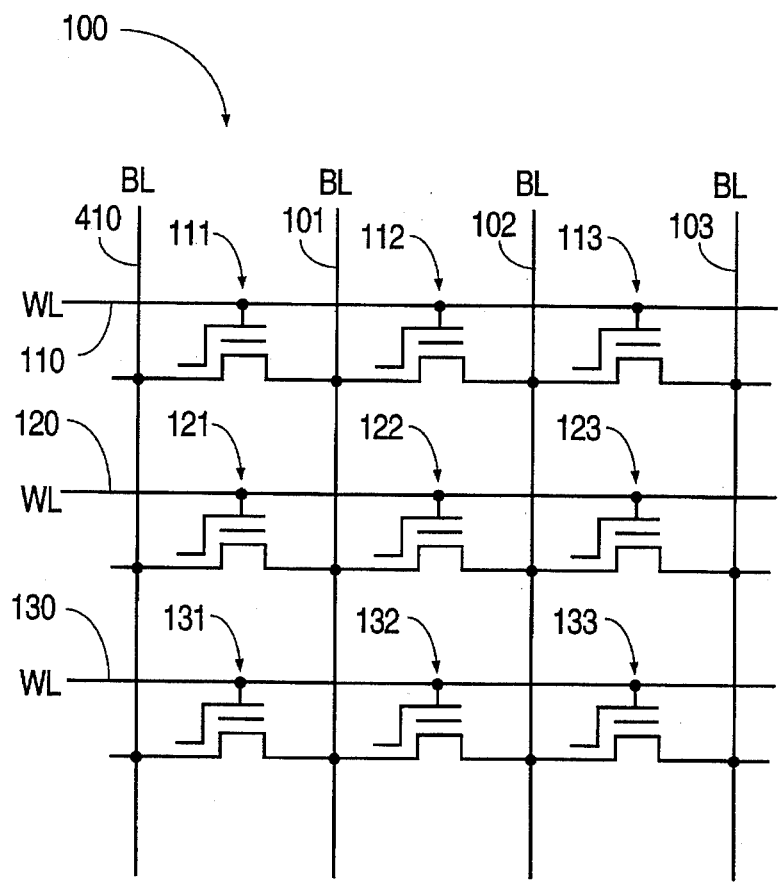
FIG. 4 is an equivalent transistor-level schematic diagram of the memory array of FIG. 1.

The memory array 100 shown in FIG. 1 is a remarkably compact array structure. The portion illustrated represents only a part of a larger grouping of cells, which may serve as the memory array or as a subarray for a larger memory array organized in accordance with other memory design principles. In the interest of clarity, such well known memory elements as sense amplifiers, latches, pull-up circuits, word line amplifiers, and word and bit line decoders are omitted from the figures showing the memory array 100.

Figure 5:
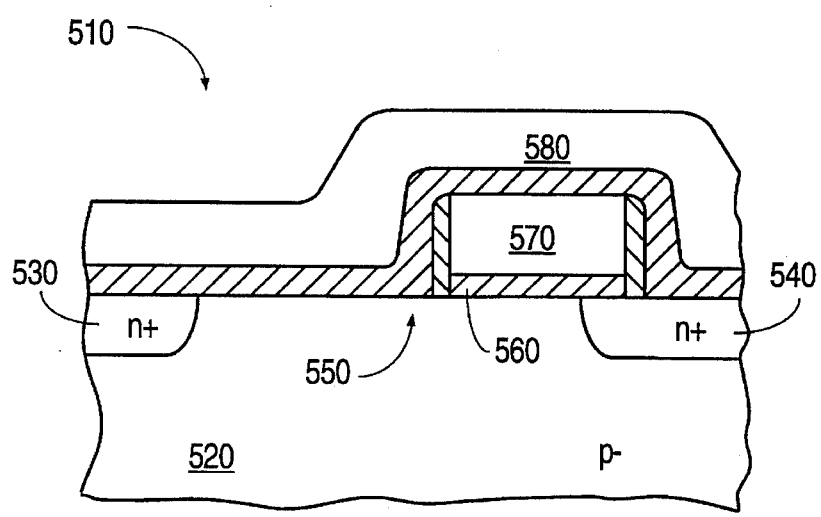
FIG. 5 is a cross-sectional diagram of a type of EEPROM memory cell based on Fowler-Nordheim tunneling and useful in the memory array of FIG. 1.

The memory array 100 includes identical Flash EEPROM memory cells 111–113, 121–123, and 131–133, which are of the type shown in FIG. 5 as cell 510. The cell 510 is an n-channel Flash EEPROM cell which includes an n-type source 530 and an n-type drain 540 disposed in a p-type semiconductor substrate region 520. Erasure and programming are based on Fowler-Nordheim tunneling through a tunnel oxide 560. A channel region 550 is defined in the substrate region 520 between the source 530 and drain 540. Minority carrier conduction in the part of the channel region 550 adjacent the drain 540 is controlled by the combined effect of a floating gate 570 and a control gate 580, in a manner well known in the art. Minority carrier conduction in the part of the channel region 550 adjacent the source 530 is controlled by the control gate 580, in the manner of a select transistor. This arrangement, called a "split gate" arrangement, is particularly advantageous because it includes an integrated transistor to control the electrical current in the channel region 550 which is partially controlled by a floating gate. Therefore if the channel region under the floating gate 570 is in depletion-mode due to over-erase, the split gate arrangement still turns off the leakage current path between the drain 540 and the source 530.

While the small size of the flash EEPROM cell 510 of FIG. 5 renders cell 510 particularly well suited for inclusion in the memory array 100 shown in FIG. 1, other types of Flash EEPROM cells based on Fowler-Nordheim tunneling may be used as well. For example, the EEPROM transistor described in U.S. application Ser. No. 07/645,507, filed Jan. 24, 1991 (entitled "Single Transistor EEPROM Architecture" and naming Nagesh Challa as inventor), and in U.S. application Ser. No. 07/973,809, filed Nov. 9, 1992 (entitled "Single Transistor EEPROM Architecture" and naming Nagesh Challa as inventor), which is hereby incorporated herein by reference in its entirety may be paired with a separate conventional n-channel MOSFET select transistor, although such a combination would not be as compact as the cell 510.

Cells 111–113, 121–123, and 131–133 are incorporated into the memory array 100 in a substantially identical manner. The incorporation of cell 122 is representative. With reference to FIGS. 1–4 (dielectric structures are omitted from FIGS. 2 and 3 for clarity), note that the floating gate 175 (other floating gates in the memory array 100 are indicated at 171–174 and 176–179) is uniquely associated with cell 122, while the control gate 280 is part of the word line conductor 120. Note also that the source of the cell 122 is part of a buried bit line 101, while the drain of the cell 122 is part of a buried bit line 102. The use of each buried bit line as a source for one cell and a drain for an adjacent cell helps to achieve a small cell and array size.

Erasure and programming of the cell 510 is in accordance with Fowler-Nordheim tunneling through a portion of a dielectric 560 between the drain 540 and the floating gate 570. The cell 510 is erased, or placed in a high voltage threshold state $V_{th}$, by applying a potential difference across the control gate 580 and either the drain 540, the channel region 550, or both, so that electrons tunnel through the dielectric 560 to reside in the floating gate 570. Applying a voltage to the channel region 550 is known as "backgating" or "backbiasing" the MOSFET transistors in the cell 550. An illustrative erase voltage is eighteen volts, although it will be appreciated that the design of cells having other values of erase voltage is within the ability of one of ordinary skill in the art. The cell 510 is programmed by applying a particular voltage to the control gate 580 and by applying to the drain 540 a voltage relative to the control gate voltage which for one logical state of the data causes electrons to tunnel from the floating gate 570 to the drain 540 through the dielectric 560 to place the cell in a low threshold voltage state $V_{t1}$, and which for the other logical state of the data does not cause electrons to tunnel from the floating gate 570 to the drain 540 so that the high voltage threshold state $V_{th}$ is maintained. An illustrative programming voltage is fifteen volts, although it will be appreciated that the design of cells having other values of programming voltage is within the ability of one of ordinary skill in the art. The cell 510 is read by placing a sufficient sense voltage difference across the source 530 and the drain 540, and a read voltage $V_r$ on the control gate 580. The value of read voltage $V_r$ is sufficient to induce a channel in the portion of the channel region 550 adjacent the source 530. The value of read voltage $V_r$ is sufficient to induce a channel in the portion of the channel region 550 adjacent the drain 540 if the threshold voltage of the cell 510 is $V_{t1}$, and insufficient to induce a channel in the portion of the channel region 550 adjacent the drain 540 if the threshold voltage of the cell 510 is $V_{th}$. An illustrative sense voltage difference is two volts and an illustrative read voltage is three volts, although it will be appreciated that the design of cells having other values of sense and read voltages is within the ability of one of ordinary skill in the art.

Illustrative voltages for the various modes of operation of the memory array 100 are summarized in Table 1, with reference to cells 121, 122 and 123.

TABLE 1

| MODE | | WL 110 130 | WL 120 | BL 410 | BL 101 | BL 102 | BL 103 | SUB |
|---|---|---|---|---|---|---|---|---|
| ERASE | Make $V_t$ of cells 121, 122 and 123 high | 15 | 15 | −3 | −3 | −3 | −3 | −3 |
| PROGRAM | Make $V_t$ of cell 122 low; do not disturb $V_t$ of other cells | 0 | −11 | 0 | 0 | 4 | 0 | 0 |
| READ | Source/drain can be assigned either way | | | | | | | |
| | Cell 122 (S/D: 101/102) | 0 | 3 | F | 0 | 2 | F | 0 |
| | Cell 122 (S/D: 102/101) | 0 | 3 | F | 2 | 0 | F | 0 |

Illustrative, the memory array 100 is erased by placing a voltage on the word lines 110, 120 and 130 that is sufficiently positive relative to the voltage on the bit lines 410, 101, 102 and 103 so that tunneling occurs into the floating gate of each of the cells 111–113, 121–123 and 131–133, thereby placing the cells in the $V_{th}$ state. For example, the entire memory array 100 is erased by applying fifteen volts to word lines 110, 120 and 130 and minus three volts to the bit lines 410, 101, 102 and 103 and backbias. Focussing on cell 122 as illustrative of the other cells in the memory array 100 during erasure, the substrate 290 (which may be a p-well, for example) and the drain (bit line 102) of cell 122 are at minus three volts while the control gate 280 is at fifteen volts. Electrons tunnel from the source and channel regions of the cell 122 into the floating gate 175, causing the cell 122 to acquire a high threshold voltage $V_{th}$.

Alternatively, erasing may be done on a word-by-word basis by placing the sufficiently positive voltage on one particular word line while floating the other word lines, or while maintaining the voltage on the other word lines at a suitable voltage, illustratively about the voltage on the bit lines, so that erasure does not occur.

Illustratively, a single cell of the memory array 100 is programmed by placing a voltage on its associated word line that is sufficiently negative relative to the voltage on the associated bit line so that tunneling occurs from the floating gate, thereby placing the cell in the $V_{t1}$ state. To program cell 122, for example, minus eleven volts is placed on the word line 120 and plus four volts is placed on the bit line 102 to provide the illustrative tunneling voltage of fifteen volts. The other word lines 110 and 130 and the other bit lines 101 and 103 are held at zero so that the voltage across the control gates and drains of the other cells in the memory array is insufficient to cause tunneling. The binary values stored in those cells is unaffected. Specifically, the voltage across the control gates and drains is zero for cells 111, 113, 131 and 133, four volts for cells 112 and 132, and minus eleven volts for cells 121 and 123, all insufficient to appreciably change the Vt of those memory cells.

Illustratively, a single cell of the memory array 100 is read by precharging one of the bit lines associated with the cell while placing the other associated bit line at reference potential and applying a read voltage on its associated word line. Unassociated bit lines are left floating. Note that advantageously either bit line may serve as source while the other serves as drain. Cell 122 is read, for example, by precharging bit line 102 to two volts and applying zero volts to bit line 101 and three volts to the word line 120. If cell 122 is in a $V_{th}$ state, the cell remains nonconductive and the bit line 102 remains charged, indicating a logical zero, for example. If cell 122 is in a $V_{t1}$ state, the cell becomes conductive and the bit line 102 discharges, indicating a logical one, for example.

Because the word line 120 is at $V_r$, the select transistors in the memory cells 121 and 123 are on and the cells themselves could be conductive depending on the value of their $V_r$. Since bit line 410 associated with cell 121 and bit line 103 associated with cell 123 are floating, neither memory cells 121 nor 123 actually conducts, and the reading of memory cell 122 is unaffected.

The word lines 110 and 130 are at reference potential. Hence, the select transistors in the memory cells 111–113 and 131–133 are off and prevent the memory cells 111–113 and 131–133 from being read.

The memory array 100 may be fabricated in any suitable field effect transistor technology by any suitable process. Fabrication of the memory array 100 in accordance with, for example, an illustrative CMOS process is shown generally in FIGS. 6–9, although it will be understood that NMOS and other CMOS processes may be used as well. It will also be understood that some of the steps described are not used in the formation of the memory array 100, but are useful in forming circuits that may be formed outside of the region shown in FIG. 1.

The starting material is a p-type substrate 290 doped to a conductivity of, for example, 25 ohm-cm. The first mask, an n-well mask, is applied after an initial oxidation and nitride deposition, followed by a nitride etch, an n-well implant, an n-well oxidation, a nitride strip, a p-well implant, an n-well drive-in, and an oxide removal. The second mask, an active area mask, is applied after a base oxidation and nitride deposition, followed by a nitride etch and a blanket n-field implant. The third mask, a p-field mask, is then applied, followed by an p-field implant, resist removal, and a field oxidation.

Figure 6:
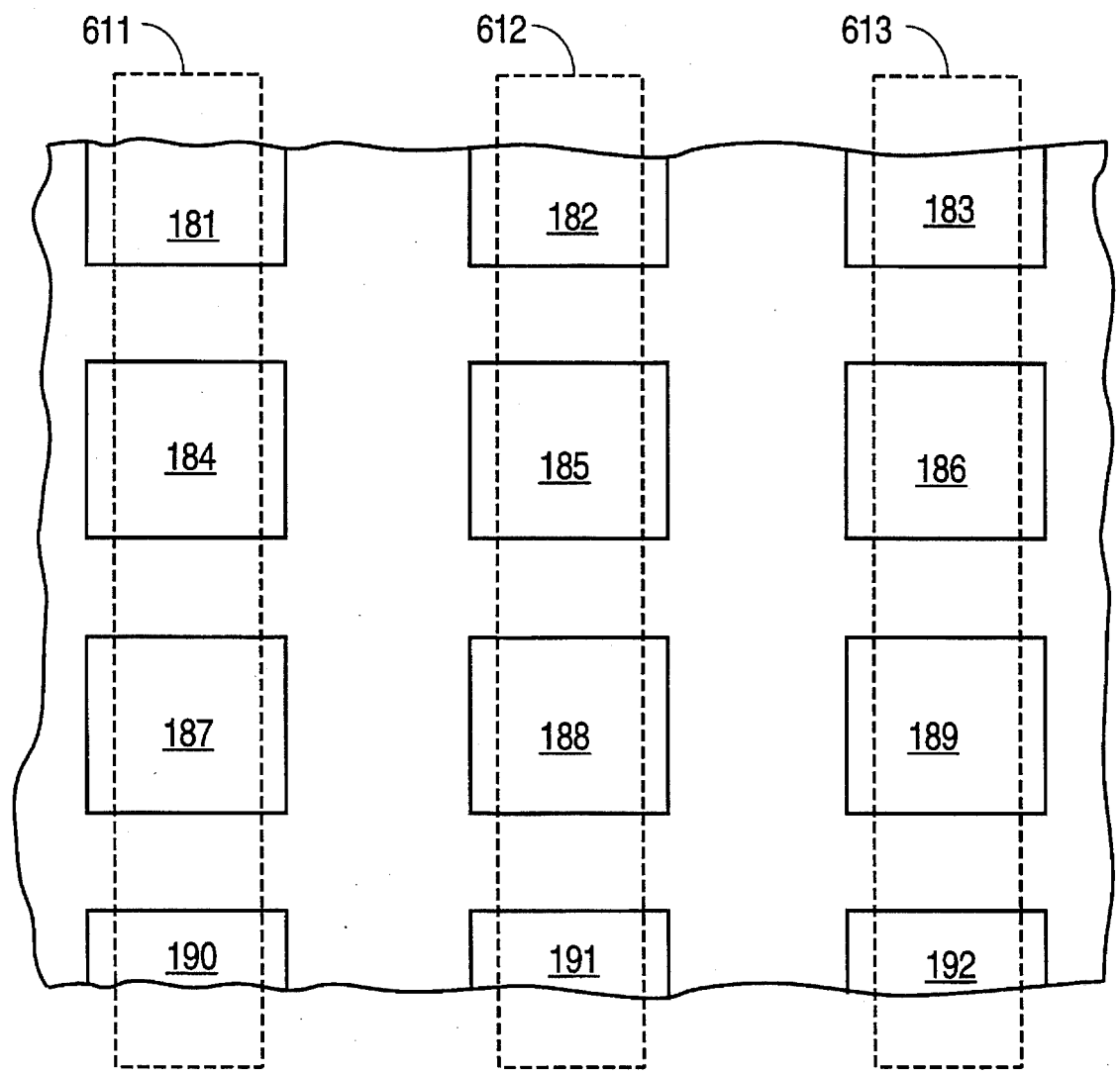
FIGS. 6–8 are composite layout diagrams representing the memory array of FIG. 1 in various stages of fabrication.

In the field oxidation step, a matrix of field oxide islands 181–192 is formed in a p-region of the substrate 290, as shown in FIG. 6. Each of the field oxide islands 181–192 is 6500 Å thick, and is a rectangle measuring about 1.4 microns from left to right, and about 1.2 microns from top to bottom. The p-type active area between adjacent islands 181–192 measured from left to right is about 1.2 microns, while the p-type active area between adjacent islands 181–192 measured from top to bottom is about 0.6 microns.

Following field oxidation, a nitride strip is done, followed by a pre-gate oxidation to form a 300 Å oxide. The fourth mask, a cell mask, is then applied, followed by a suitable array $V_t$ implant, a sacrificial oxide removal, and an array gate oxidation. Illustratively, gate oxide is formed to a thickness of 100 Å.

The fifth mask, a first poly mask, is applied after a layer of polysilicon is deposited to a thickness of 1500 Å and suitably implanted with a dopant such as, for example, phosphorus at a dose of $5 \times 10^{14}$ and an energy of 30 Kev. After the first poly mask is applied, the first polysilicon layer is etched to form numerous polysilicon features, including polysilicon strips 611–613 as shown in FIG. 6. Polysilicon strips 611–613 run from top to bottom over, respectively, islands 181, 184, 187, and 190; islands 182, 185, 188, and 191; and islands 183, 186, 189 and 192. A resist removal step follows.

Figure 7:
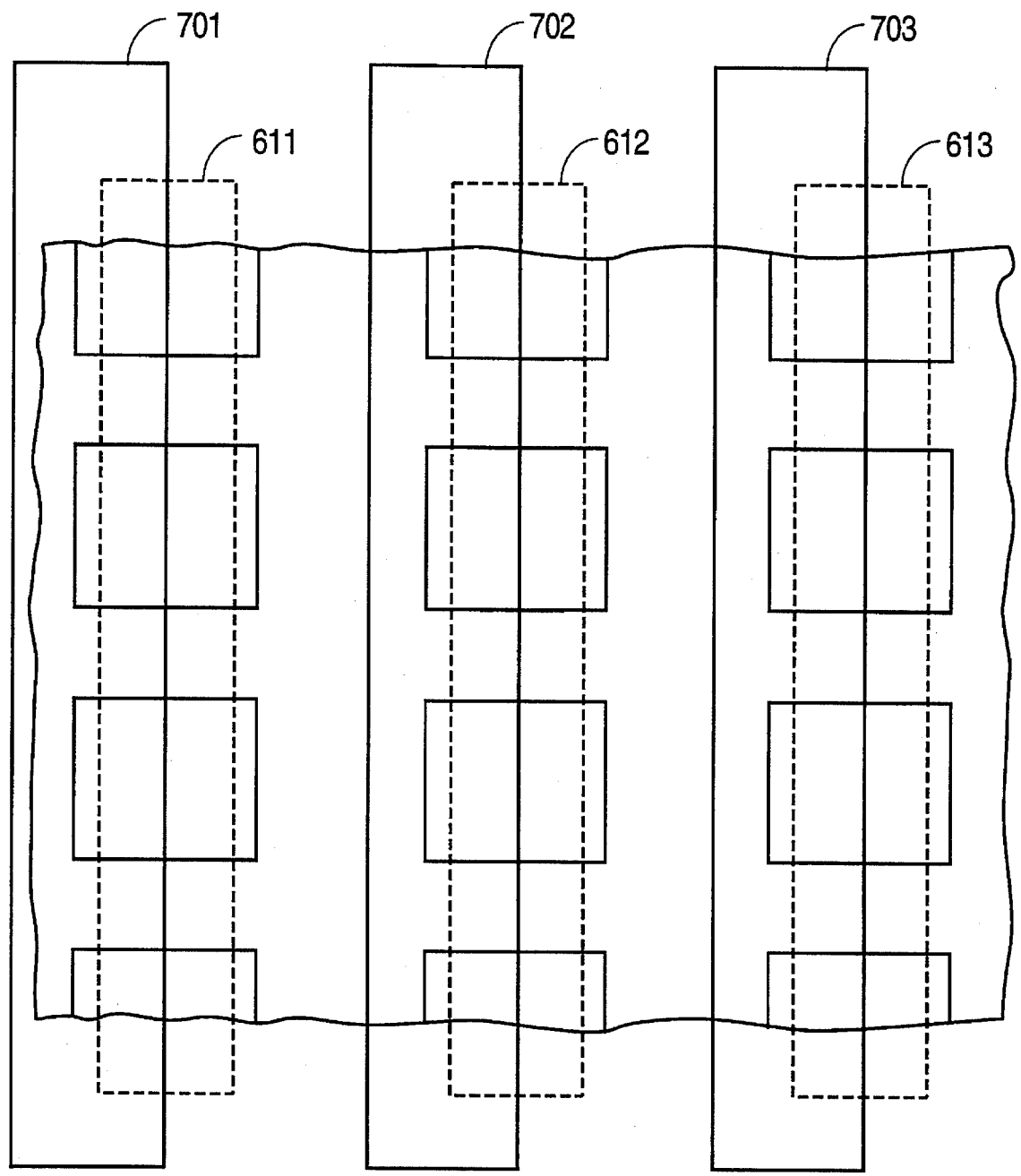
Figure 8:
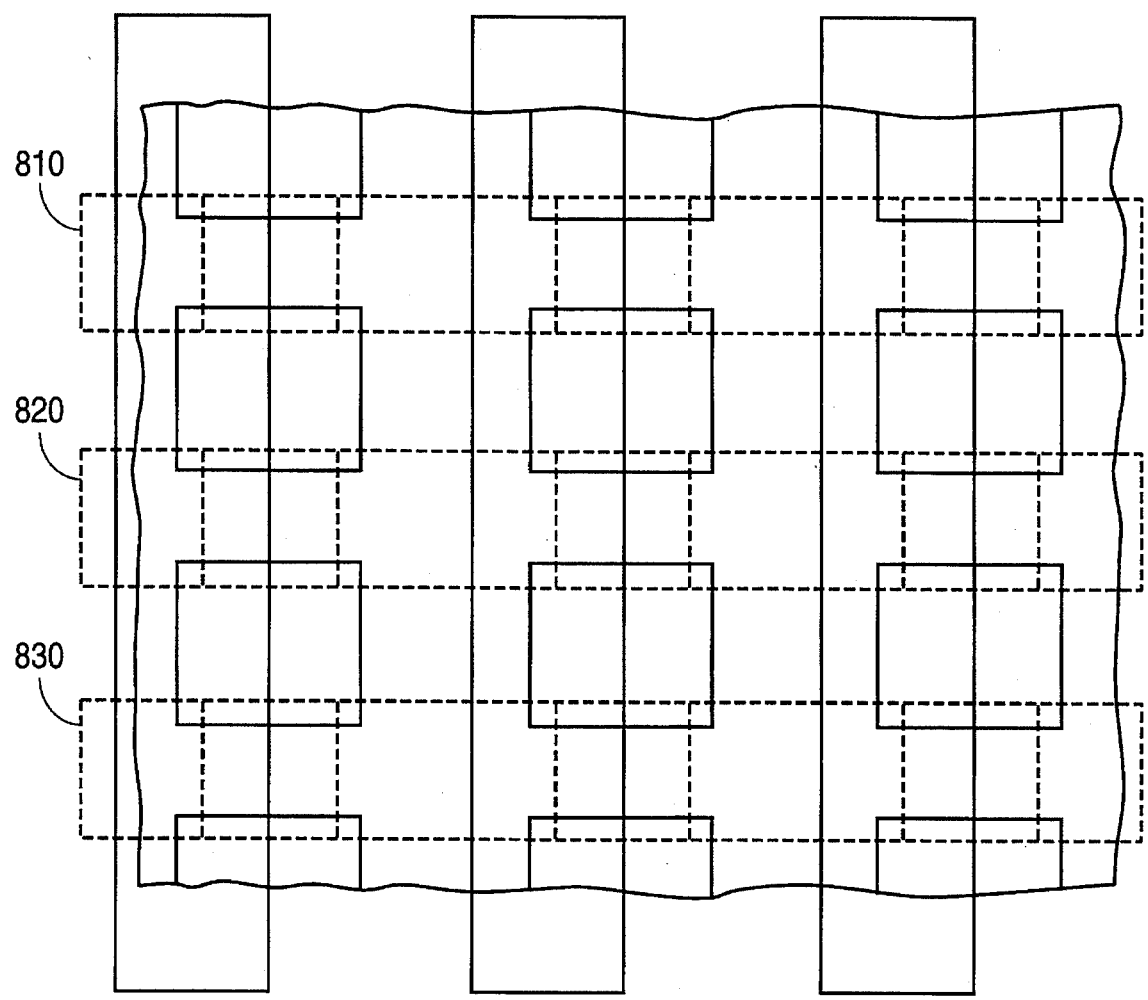

The sixth mask, a buried bit line implant mask, is applied next. As shown in FIG. 7, the bit line implant mask includes protective strips 701, 702 and 703, and an n+ implant is made through the windows between, for example, the strips 611 and 702 and the strips 612 and 703, to form the buried bit lines 101 and 102. The implant is any suitable n-type dopant or combination implanted at any suitable dose and energy. For example, a suitable dopant combination is arsenic implanted at a dose of $2 \times 10^{15}$ and an energy of 80 Kev, followed by phosphorus implanted at a dose of $2 \times 10^{14}$ and an energy of 80 Kev. This combined implant results in an n-type sheet resistance of from about 25 to 35 ohms/square. The resist is removed, followed by a sequence of steps to form a dielectric layer such as, for example, an oxide-nitride-oxide ("ONO") sandwich. Illustratively, the first layer is a 120 Å oxide formed by a polysilicon oxidation, the next layer is a 120 Å nitride layer formed by nitride deposition, and the next layer is a 50 Å oxide formed by oxidation of the nitride layer, resulting in a 200 Å oxide equivalent dielectric.

The seventh mask is an $V_t$ implant mask, followed by a blanket $V_t$ adjust implant to achieve the native $V_r$.

An eighth mask, an array protect mask, is then applied. The array protect mask protects the ONO dielectric, which is an interpoly dielectric, in the memory array area as areas (not shown) outside of the memory array area are etched to remove the ONO dielectric in preparation for gate dielectric formation. Next, a gate oxide is grown by any suitable process in areas outside of the memory array area to form a gate dielectric about 250 Å thick.

A ninth mask, a second poly mask, is applied after a second poly deposition and a tungsten silicide deposition. The second poly is deposited to any suitable thickness such as, for example, a thickness in the range 1000 Å–2000 Å. The tungsten silicide is deposited to any suitable thickness such as, for example, a thickness in the range of 1000 Å–2000 Å. In the memory array 100 area, the second poly mask includes protective strips 810, 820 and 830. The next step is a second poly etch, which results in the word lines 110, 120 and 130 being formed under the protective strips 810, 820 and 830. The second poly etch is followed by a first poly etch to remove exposed regions of the first poly strips 611–613, resulting in the self-aligned polysilicon rectangles 171–179 that form the respective floating gates of the cells 111–113, 121–123, and 131–133. The next step is a second poly oxidation step.

The subsequent steps are any suitable steps for completing the devices, including passivation, forming contact vias to the various device terminals, and metalization. Steps of this nature, commonly referred to as the CMOS back end, are well known in the art.

The description of the invention set forth herein is illustrative, and does not necessarily limit the scope of the invention as set forth in one or more of the following claims. Many variations and modifications may be made based on the description set forth herein, without departing from the scope and spirit of the invention. For example, the operating voltages for the memory array 100 set forth herein are illustrative, and other operating voltages may be used depending on the particulars of the devices and processes used to form them. Moreover, terms such as word line and bit line are used in their broad, nonlimiting sense. For example, as applied to some types of memories, "bit line" means a global data carrying line, while as applied to other types of memories, "bit line" means a local data carrying line.

What is claimed is:

1. A memory cell that is electrically erasable and programmable, comprising:
    a semiconductor body of a first conductivity type having a generally planar surface region;
    a first electrically conductive line of a second conductivity type extending into the semiconductor body from the generally planar surface region, the first line including a data carrying capability;
    a second electrically conductive line of the second conductivity type extending into the semiconductor body from the generally planar surface region and spaced apart from the first line;
    a first section comprising a drain formed at least in part by the first line, a first channel region disposed adjacent the drain in the semiconductor body, a floating gate overlapping the first channel region and further overlapping at least a portion of the drain and insulated therefrom by a dielectric for supporting Fowler-Nordheim tunneling, and a first control gate overlapping at least a portion of the floating gate over the first channel region, the first channel region being within control of the floating gate and the first control gate; and
    a second section comprising a source formed at least in part by the second line, a second channel region disposed adjacent the source in the semiconductor body, and a second control gate, overlapping the second channel region, the second channel region being within control of the second control gate, the first and second control gates being integral, and the first and second channel regions being integral.

2. A memory cell as in claim 1 wherein the substrate is a p-type region and the first line is an n-type region.

3. A memory cell as in claim 2 wherein the first line is a heavily doped n-type region.

4. A memory cell as in claim 1 wherein the second line includes a data carrying capability.

5. A memory cell as in claim 4 wherein the substrate is a p-type region, the first line is an n-type region, and the second line is an n-type region.

6. A memory cell as in claim 5 wherein the first and second lines are heavily doped n-type regions.

7. A memory cell as in claim 1 wherein the first and second control gates are part of a word line, and wherein the first line is part of a bit line.

8. A memory cell that is electrically erasable and programmable, comprising:
    a p-type semiconductor body;
    a first n-type bit line extending into the semiconductor body from a first surface strip of the semiconductor body;
    a second n-type bit line extending into the semiconductor body from a second surface strip of the semiconductor body, the second bit line being parallel to the first bit line;
    a control gate comprising an electrically conductive polysilicon strip disposed over the semiconductor body and transverse to the first and second bit line for controlling a channel region disposed in the semiconductor body under a third surface strip and between the first and second bit lines, the first, second and third surface strips being coplanar and a portion of the first bit line being adjacent the channel region for functioning as a drain, and a portion of the second bit line being adjacent the channel region for functioning as a source; and
    a floating gate comprising a polysilicon element disposed between a portion of the polysilicon strip and a portion of the semiconductor body comprising a portion of the drain and a portion of the channel region adjacent the drain, the floating gate polysilicon element being separated from the drain by a dielectric for supporting Fowler-Nordheim tunneling.

9. A memory element as in claim 8 wherein the polysilicon element is separated from the semiconductor body portion by a tunnel dielectric.

10. An electrically erasable and programmable memory array comprising:
    a semiconductor body having a generally planar major surface;
    a plurality of buried data carrying lines extending into the semiconductor body from the major surface thereof;
    a plurality of word lines;
    a plurality of memory cells, each of the memory cells being associated with one of the word lines and one of the data carrying lines and comprising a select transistor coupled to an electrically erasable programmable read-only memory ("EEPROM") transistor, the EEPROM transistor having a control gate and a floating gate and further having a drain insulated from the floating gate by a tunnel dielectric and coupled to the associated one of the data carrying lines, the select transistor having a control gate and further having a source coupled to one of the data carrying lines adjacent the associated data carrying line, the control gates of the select transistor and the EEPROM transistor being commonly coupled to the associated one of the word lines.

11. An electrically erasable and programmable memory array comprising:
    a semiconductor body having a generally planar major surface;
    a plurality of substantially parallel data carrying lines extending into the semiconductor body from the major surface thereof;
    a plurality of substantially parallel word lines disposed over the semiconductor body, the word lines being transverse to the data carrying lines; and
    a plurality of memory cells, each of the memory cells being associated with one of the word lines and one of the data carrying lines and comprising a select transistor having a control gate for controlling a first channel, integrated with an electrically erasable programmable read-only memory ("EEPROM") transistor having a control gate for controlling a second channel and a floating gate, the EEPROM transistor further having a drain comprising a pan of the associated one of the data carrying lines and insulated from the floating gate by a tunnel dielectric, the select transistor having a source comprising a part of one of the data carrying lines adjacent the associated data carrying line, the control gates of the select transistor and the EEPROM transistor being integral with the associated word line, and the first and second channels of the select transistor and the EEPROM transistor respectively being integral.

12. An electrically erasable and programmable memory cell disposed in a generally planar surface region of a semiconductor substrate, comprising:

a first doped region extending into the substrate from the surface region, the first doped region providing a bit line connectable to other cells in a column;

a second doped region extending into the substrate from the surface region and separated from the first doped region by a channel region;

a floating gate disposed over a portion of the channel region and insulated therefrom by a dielectrics and further disposed over a portion of the first doped region and insulated therefrom by a tunnel dielectric;

a control gate disposed over the floating gate and over the channel region, and insulated therefrom by a dielectric.

13. A memory cell as in claim 12 wherein the first and second doped regions are n-type and the substrate is p-type.

14. A memory cell as in claim 13 wherein:

the floating gate and the word line comprise polysilicon; and the tunnel dielectric comprises silicon dioxide.

15. An array of electrically erasable and programmable memory cells disposed in a region of a semiconductor substrate, comprising:

a first doped region extending into the substrate from a first generally planar strip-like surface region of the substrate, the first doped region providing a bit line; and a second doped region extending into the substrate from a second generally planar strip-like surface region of the substrate, the second doped region being parallel to the first doped region;

wherein each of the memory cells comprises:

a channel region disposed between the first doped region and the second doped region and extending from a third generally planar surface region of the substrate, the first, second and third surface regions being coplanar;

a floating gate disposed over a portion of the channel region and insulated therefrom by a dielectric, and further disposed over a portion of the first dope region and insulated therefrom by a tunnel dielectric; and a control gate disposed over the floating gate and over the channel region, and insulated therefrom by a dielectric.

16. A memory cell as in claim 15 wherein the first and second doped regions are n-type and the substrate is p-type.

17. A memory cell as in claim 15 wherein:

the floating gate and the word line comprise polysilicon; and the tunnel dielectric comprises silicon dioxide.

18. A memory cell as in claim 7 wherein the first and second channel regions comprise a dopant having a substantially uniform distribution in a direction parallel to the substantially planar surface.

19. A memory cell as in claim 8 wherein the control gate is a region of a word line.

20. A memory cell as in claim 19 wherein the channel region comprises a dopant having a substantially uniform distribution in a direction parallel to the third surface strip.

21. A memory cell as in claim 10 wherein the control gates of the select transistor and the EEPROM transistor comprise portions of the associated one of the word lines.

22. A memory cell as in claim 21 wherein the select and EEPROM transistors comprise an integrated channel with a dopant having a substantially uniform distribution in a direction parallel to the generally planar major surface.

23. A memory cell as in claim 11 wherein the control gates of the select transistor and the EEPROM transistor comprise portions of the associated word line.

24. A memory cell as in claim 23 wherein the first and second channels comprise a dopant having a substantially uniform distribution in a direction parallel to the generally planar major surface.

25. A memory cell as in claim 12 wherein the control gate comprises a portion of a word line.

26. A memory cell as in claim 25 wherein the channel region comprises a dopant having a substantially uniform distribution in a direction parallel to the generally planar surface region.

27. A memory cell as in claim 25 wherein the control gate of each of the memory cells comprises a portion of a word line.

28. A memory cell as in claim 27 wherein the channel region comprises a dopant having a substantially uniform distribution in a direction parallel to the third surface region.

* * * * *